United States Patent
Ando et al.

(10) Patent No.: US 11,063,089 B2
(45) Date of Patent: *Jul. 13, 2021

(54) RESISTIVE MEMORY DEVICE WITH MESHED ELECTRODES

(71) Applicant: INTERNATIONAL BUSINESS MACHINES CORPORATION, Armonk, NY (US)

(72) Inventors: Takashi Ando, Tuckahoe, NY (US); Lawrence A. Clevenger, Saratoga Springs, NY (US); Chih-Chao Yang, Glenmont, NY (US); Michael Rizzolo, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/654,102

(22) Filed: Oct. 16, 2019

(65) Prior Publication Data

US 2020/0111837 A1    Apr. 9, 2020

Related U.S. Application Data

(63) Continuation of application No. 16/153,237, filed on Oct. 5, 2018, now Pat. No. 10,546,892.

(51) Int. Cl.
*H01L 27/24* (2006.01)
*H01L 45/00* (2006.01)

(52) U.S. Cl.
CPC ...... *H01L 27/2463* (2013.01); *H01L 27/2472* (2013.01); *H01L 27/2481* (2013.01); *H01L 45/1253* (2013.01); *H01L 45/145* (2013.01)

(58) Field of Classification Search
CPC ....... H01L 27/2463–2481; H01L 45/145–147; H01L 45/1253–1273; H01L 27/249; G11C 2213/70–82; G11C 2213/52
See application file for complete search history.

(56) References Cited

U.S. PATENT DOCUMENTS

| | | |
|---|---|---|
| 7,855,435 B2 | 12/2010 | Klostermann et al. |
| 7,897,955 B2 | 3/2011 | Jin et al. |
| 8,129,250 B2 | 3/2012 | Rossel et al. |
| 8,779,405 B2 | 7/2014 | Zhou et al. |
| 9,114,980 B2 | 8/2015 | Zhou et al. |
| 9,153,779 B2 | 10/2015 | Ariga et al. |

(Continued)

OTHER PUBLICATIONS

List of IBM Patents or Patent Applications Treated as Related dated Oct. 16, 2019, 2 pages.

(Continued)

*Primary Examiner* — Amar Movva
(74) *Attorney, Agent, or Firm* — Tutunjian & Bitetto. P.C.; Randall Bluestone

(57) ABSTRACT

A method is presented for incorporating a resistive random access memory (RRAM) stack within a resistive memory crossbar array. The method includes forming a conductive line within an interlayer dielectric (ILD), constructing a barrier layer over a portion of the conductive line, forming a bottom meshed electrode, depositing a dielectric layer over the bottom meshed electrode, and forming a top meshed electrode over the dielectric layer, where each of the top and bottom meshed electrodes includes a plurality of isolations films.

19 Claims, 4 Drawing Sheets

(56) References Cited

U.S. PATENT DOCUMENTS

| | | |
|---|---|---|
| 9,613,694 B1 | 4/2017 | Li et al. |
| 10,546,892 B1 * | 1/2020 | Ando .................. H01L 45/04 |
| 2014/0264247 A1 | 9/2014 | Daryanani et al. |

OTHER PUBLICATIONS

Applicants: Takashi Ando et al, Examiner: to be Determined, Serial No. to be Determined, Filed: Concurrently Herewith, For: Resistive Memory Device With Meshed Electrodes.

Hayakawa et al., "Highly reliable TaOx ReRAM with centralized filament for 28-nm embedded application", 2015 Symposium on VLSI Technology Digest of Technical Papers. Jun. 16-18, 2015. pp. 1-2.

Wong et al., "Metal-Oxide RRAM", Proceedings of the IEEE. vol. 100, No. 6. Jun. 2012. pp. 1951-1970.

* cited by examiner

RESISTIVE MEMORY DEVICE WITH MESHED ELECTRODES

BACKGROUND

Technical Field

The present invention relates generally to semiconductor devices, and more specifically, to a resistive memory device with meshed electrodes.

Description of the Related Art

Resistive random access memory (RRAM) is considered a promising technology for electronic synapse devices or memristors for neuromorphic computing as well as high-density and high-speed non-volatile memory applications. In neuromorphic computing applications, a resistive memory device can be employed as a connection (synapse) between a pre-neuron and post-neuron, representing the connection weight in the form of device resistance. Multiple pre-neurons and post-neurons can be connected through a crossbar array of RRAMs, which can express a fully-connected neural network configuration.

SUMMARY

In accordance with an embodiment, a method is provided for incorporating a resistive random access memory (RRAM) stack within a resistive memory crossbar array. The method includes forming a conductive line within an interlayer dielectric (ILD), constructing a barrier layer over a portion of the conductive line, forming a bottom meshed electrode, depositing a dielectric layer over the bottom meshed electrode, and forming a top meshed electrode over the dielectric layer, where each of the top and bottom meshed electrodes includes a plurality of isolations films.

In accordance with another embodiment, a method is provided for incorporating a resistive random access memory (RRAM) stack within a resistive memory crossbar array. The method includes forming a conductive line within an interlayer dielectric (ILD), forming the RRAM stack over the conductive line, the RRAM stack constructed by forming a bottom meshed electrode, depositing a dielectric layer over the bottom meshed electrode, and forming a top meshed electrode over the dielectric layer, where each of the top and bottom meshed electrodes includes a plurality of isolations films.

In accordance with yet another embodiment, a semiconductor device is provided for incorporating a resistive random access memory (RRAM) stack within a resistive memory crossbar array. The semiconductor device includes a conductive line constructed within an interlayer dielectric (ILD), a barrier layer disposed over a portion of the conductive line, a bottom meshed electrode, a dielectric layer disposed over the bottom meshed electrode, and a top meshed electrode disposed over the dielectric layer, where each of the top and bottom meshed electrodes includes a plurality of isolations films.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for constructing resistive random access memory (RRAM) devices with meshed top and bottom electrodes. The RRAMs can be employed for electronic synapse devices or memristors for neuromorphic computing as well as high-density and high-speed non-volatile memory applications. In neuromorphic computing applications, a resistive memory device can be employed as a connection (synapse) between a pre-neuron and post-neuron, representing a connection weight in the form of device resistance. Multiple pre-neurons and post-neurons can be connected through a crossbar array of RRAMs, which can be configured as a fully-connected neural network. Large scale integration of large RRAM arrays with complementary metal oxide semiconductor (CMOS) circuits can enable scaling of RRAM devices down to 10 nm and beyond for neuromorphic computing as well as high-density and high-speed non-volatile memory applications.

Embodiments in accordance with the present invention provide methods and devices for constructing a crossbar array structure with meshed top and bottom electrodes. Variability of switching characteristics is a concern for filament-type RRAM devices in general. The variability is partly due to a limited number of filaments. This prevents enablement of larger cross bar array structures. The exemplary embodiments of the present invention reduce variability of switching characteristics by taking advantage of averaging effect for filaments connected in parallel. This is achieved by introducing meshed electrodes with high resistivity to form multiple localized filaments. The meshed electrodes are connected to shared electrodes to make parallel connection of filaments. Thus, multiple top electrode connections can be formed within the same cell, where such configuration should average out stochastic components of switching and improve variability.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
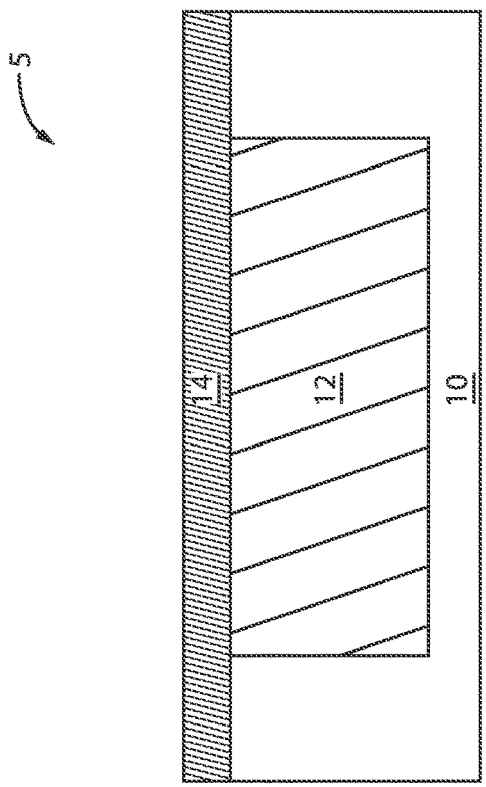
FIG. 1 is a cross-sectional view of a semiconductor structure including a conductive line formed within a dielectric layer, where a capping layer is formed over the conductive line, in accordance with an embodiment of the present invention.

FIG. 1 is a cross-sectional view of a semiconductor structure including a conductive line formed within a dielectric layer, where a capping layer is formed over the conductive line, in accordance with an embodiment of the present invention.

A semiconductor structure 5 includes a conductive line 12 formed within an inter-layer dielectric (ILD) 10. A capping layer or etch stop layer 14 can be formed over the conductive line 12, as well as the ILD 10.

The ILD 10 can include any materials known in the art, such as, for example, porous silicates, carbon doped oxides, silicon dioxides, silicon nitrides, silicon oxynitrides, or other dielectric materials. The ILD 10 can be formed using any method known in the art, such as, for example, chemical vapor deposition, plasma enhanced chemical vapor deposition, atomic layer deposition, or physical vapor deposition. The ILD 10 can have a thickness ranging from about 25 nm to about 200 nm.

The dielectric material of layer 10 can include, but is not limited to, ultra-low-k (ULK) materials, such as, for example, porous silicates, carbon doped oxides, silicon dioxides, silicon nitrides, silicon oxynitrides, carbon-doped silicon oxide (SiCOH) and porous variants thereof, silsesquioxanes, siloxanes, or other dielectric materials having, for example, a dielectric constant in the range of about 2 to about 4.

The metal line 12 can be formed in an opening or trench in the ILD 10. The metal line 12 can be any conductive material known in the art, such as, for example, copper (Cu), aluminum (Al), or tungsten (W). The metal line 12 can be fabricated using any technique known in the art, such as, for example, a single or dual damascene technique. In an embodiment, not illustrated, the metal line 12 can be copper (Cu) and can include a metal liner, where a metal liner can be metals, such as, for example, tantalum nitride and tantalum (TaN/Ta), titanium, titanium nitride, cobalt, ruthenium, and manganese.

The dielectric cap or dielectric capping layer or etch stop layer 14 can be referred to as a barrier layer or dielectric barrier layer. The dielectric material of the dielectric cap 14 can be silicon nitride (SiN), etc. In one embodiment, the etch stop layer 14 is NBLOK.

Figure 2:
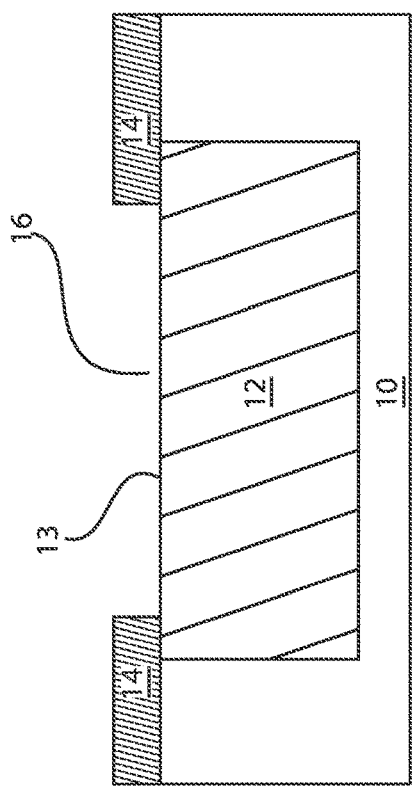
FIG. 2 is a cross-sectional view of the semiconductor structure of FIG. 1 where the capping layer is etched to expose a top surface of the conductive line, in accordance with an embodiment of the present invention.

FIG. 2 is a cross-sectional view of the semiconductor structure of FIG. 1 where the capping layer is etched to expose a top surface of the conductive line, in accordance with an embodiment of the present invention.

In various example embodiments, a portion of the dielectric cap 14 is etched or removed to form opening 16. The etching of the dielectric cap 14 results in the exposure of a portion of a top surface 13 of the conductive line 12.

Figure 3:
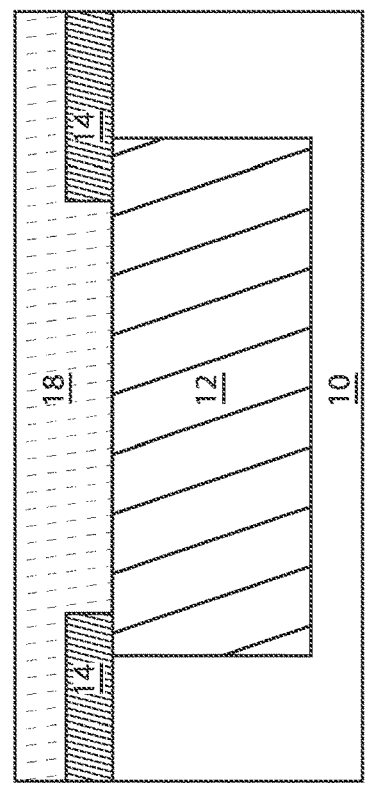
FIG. 3 is a cross-sectional view of the semiconductor structure of FIG. 2 where a barrier layer is deposited over the conductive line, in accordance with an embodiment of the present invention.

FIG. 3 is a cross-sectional view of the semiconductor structure of FIG. 2 where a barrier layer is deposited over the conductive line, in accordance with an embodiment of the present invention.

In various example embodiments, a metal nitride liner 18 is deposited over the exposed top surface of the conductive line 12, as well as over remaining portions of the dielectric cap 14. In an embodiment, the metal nitride liner 18 can be, e.g., a tantalum nitride (TaN) layer.

Figure 4:
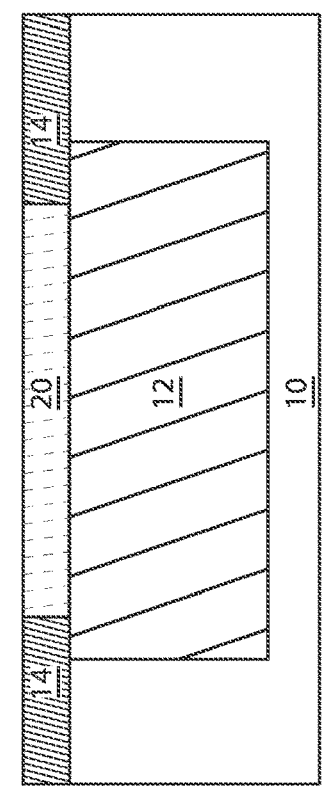
FIG. 4 is a cross-sectional view of the semiconductor structure of FIG. 3 where the barrier layer is planarized such that it is flush with the remaining capping layer, in accordance with an embodiment of the present invention.

FIG. 4 is a cross-sectional view of the semiconductor structure of FIG. 3 where the barrier layer is planarized such that it is flush with the remaining capping layer, in accordance with an embodiment of the present invention.

In various example embodiments, the metal nitride liner 18 is planarized by, e.g., CMP such that a metal nitride layer 20 is formed over the conductive line 12. The top surface of the metal nitride layer 20 is flush with a top surface of the remaining dielectric cap portions 14. The metal nitride layer 20 can be referred to as a barrier layer formed over and in direct contact with the conductive line 12.

Figure 5:
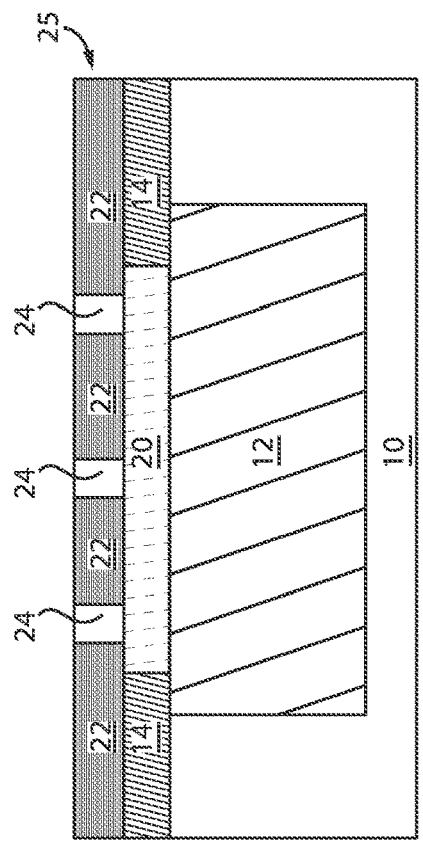
FIG. 5 is a cross-sectional view of the semiconductor structure of FIG. 4 where a metal layer is patterned on the conductive line, in accordance with an embodiment of the present invention.

FIG. 5 is a cross-sectional view of the semiconductor structure of FIG. 4 where a metal layer is patterned on the conductive line, in accordance with an embodiment of the present invention.

In various example embodiments, a metal layer 22 is patterned over the conductive line 12. The metal layer 22 includes openings 21. The metal layer 22 can be, e.g., a titanium oxynitride (TiON) layer. The metal layer 22 can be patterned by employing lithography and reactive ion etching (RIE) techniques.

The titanium oxynitride material in the titanium oxynitride layer 22 has a composition of $TiO_xN_y$, in which x can be in a range from about 0.1 to about 1.9, and y can be in a range from about 0.05 to about 0.95, and (1−x)+2y can be in a range from about 0.9 to about 2.4.

Figure 13:
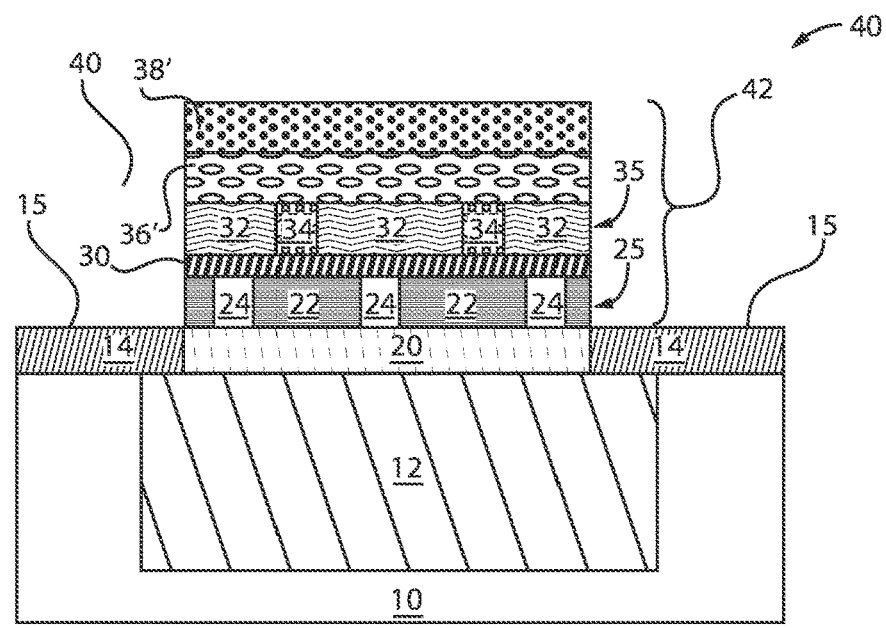
FIG. 13 is a cross-sectional view of the semiconductor structure of FIG. 12 where etching is performed to create a resistive random access memory (RRAM) stack, in accordance with an embodiment of the present invention.

The titanium oxynitride material 22 is more easily removed compared to titanium nitride material by various wet etch chemistries. For example, a wet etch chemistry employing dilute hydrofluoric acid or a combination of hydrogen peroxide and trans-1,2-cyclohexanediaminetetraacetic acid (CDTA) can remove titanium oxynitride at an etch rate that is at least an order of magnitude greater than the etch rate of titanium nitride by the same wet etch chemistry. Portions of the titanium oxynitride material 22 are removed later on in the manufacturing process when forming the RRAM stack (FIG. 13).

Figure 6:
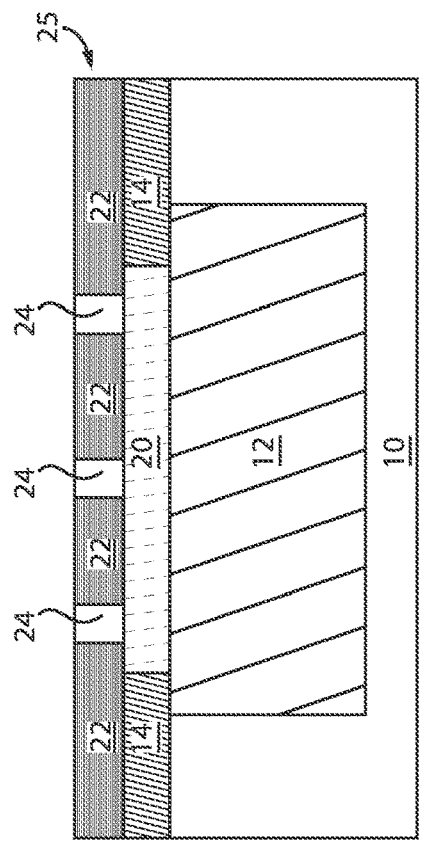
FIG. 6 is a cross-sectional view of the semiconductor structure of FIG. 5 where trenches formed by the patterned metal layer are filled with an isolation film, in accordance with an embodiment of the present invention.

FIG. 6 is a cross-sectional view of the semiconductor structure of FIG. 5 where trenches formed by the patterned metal layer are filled with an isolation film, in accordance with an embodiment of the present invention.

In various example embodiments, the openings 21 of the metal layer 22 can be filled with an isolation film 24 (or insulator segments 24). The isolation film 24 can be, e.g., silicon nitride (SiN). The isolation film 24 can be planarized. The planarization process can be provided by CMP. Other planarization process can include grinding and polishing. The isolation film 24 is a plurality of isolation films 24 that run parallel to each other.

Figure 7:
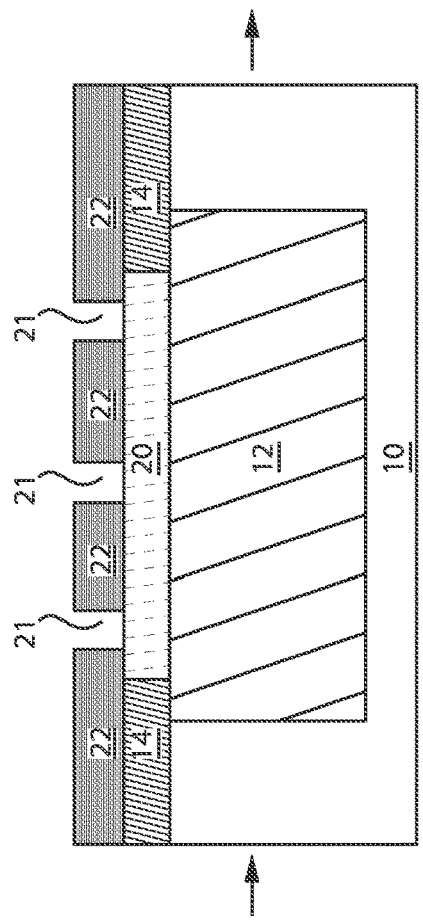
FIG. 7 is a cross-sectional view of the semiconductor structure of FIG. 4 where isolation layers are patterned on the conductive line, in accordance with another embodiment of the present invention.

FIG. 7 is a cross-sectional view of the semiconductor structure of FIG. 4 where isolation layers are patterned on the conductive line, in accordance with another embodiment of the present invention.

In various example embodiments, instead of forming the metal layer 22 first, the isolation film 24 is first formed. The isolation film 24 is formed over and in direct contact with the metal nitride layer 20. The isolation film 24 can be patterned by employing lithography and reactive ion etching (RIE) techniques.

Figure 8:
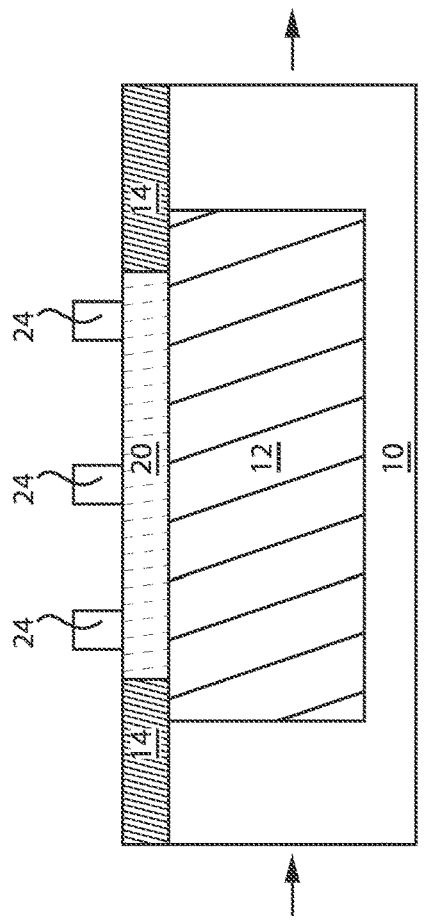
FIG. 8 is a cross-sectional view of the semiconductor structure of FIG. 7 where trenches formed by the patterned isolation film are filled with a metal, in accordance with an embodiment of the present invention.

FIG. 8 is a cross-sectional view of the semiconductor structure of FIG. 7 where trenches formed by the patterned isolation film are filled with a metal, in accordance with an embodiment of the present invention.

In various example embodiments, once the isolation film 24 has been formed, the trenches can be filled with the metal layer 22. The metal layer 22 can be planarized. The planarization process can be provided by CMP. Other planarization process can include grinding and polishing.

In FIGS. 6 and 8, the TiON 22 and the plurality of isolation films 24 can define a bottom electrode of a resistive random access memory (RRAM) device. This can be referred to as a meshed bottom electrode 25.

The bottom electrode can include a conductive material, such as Cu, Al, Ag, Au, Pt, W, etc. In some embodiments, the bottom electrode can include nitrides such as TiN, TaN, Ta or Ru. In a preferred embodiment, the bottom electrode 25 includes TiON meshed with a plurality of SiN films.

Figure 9:
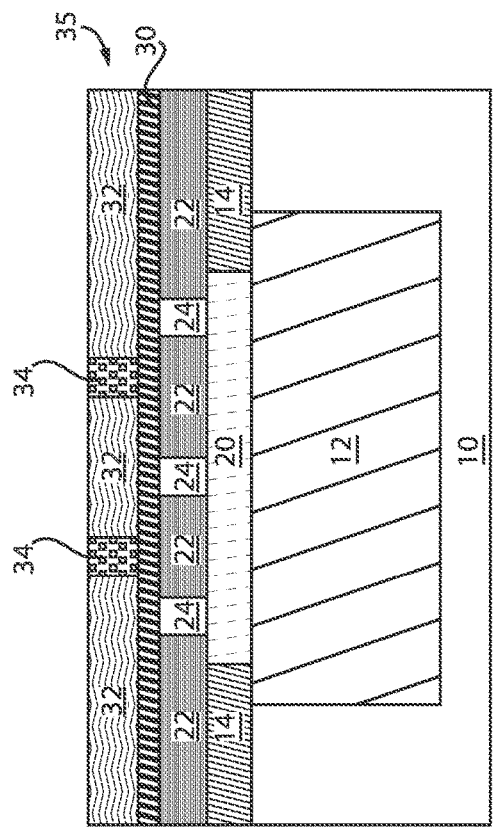
FIG. 9 is a cross-sectional view of the semiconductor structure of FIG. 6 or FIG. 8 where a metal oxide is deposited, in accordance with an embodiment of the present invention.

FIG. 9 is a cross-sectional view of the semiconductor structure of FIG. 6 or FIG. 8 where a metal oxide is deposited, in accordance with an embodiment of the present invention.

In various example embodiments, a metal oxide layer 30 can be deposited. The metal oxide layer 30 can be a hafnium oxide (HfO) layer. However, the metal oxide layer 30 can be any type of high-k dielectric layer, such as, but not limited to, $HfO_2$, HfSiO, HfSiON, HfZrO, $Ta_2O_5$, $ZrO_2$, $TiO_2$, $La_2O_3$, $Y_2O_3$, $Al_2O_3$, and mixtures thereof.

Figure 10:
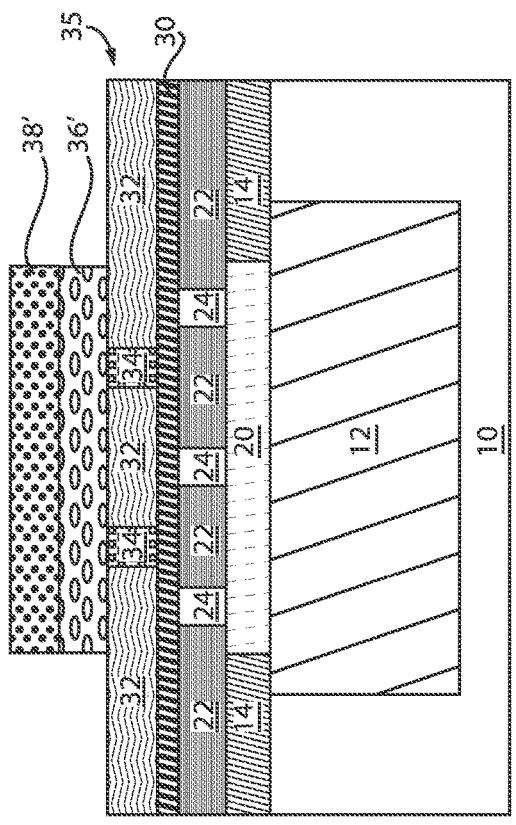
FIG. 10 is a cross-sectional view of the semiconductor structure of FIG. 9 where a meshed top electrode is formed with isolation layers, in accordance with an embodiment of the present invention.

FIG. 10 is a cross-sectional view of the semiconductor structure of FIG. 9 where a meshed top electrode is formed with isolation layers, in accordance with an embodiment of the present invention.

In various example embodiments, a metal layer 32 can be formed. The metal layer 32 can be patterned such that trenches are formed thereon. The metal layer 32 can be, e.g., a titanium oxynitride (TiON) layer. The trenches are filled with an isolation film 34 (or insulator segments 34). The isolation film 34 can be, e.g., SiN. The TiON 32 and the isolation films 34 can define a top electrode of a resistive random access memory (RRAM) device. This can be referred to as a meshed top electrode 35.

Isolation films 34 are offset from the isolation films 24. In a cross-sectional configuration, the isolation films 34 are shown to be parallel to the isolation films 24. However, in a top view (FIG. 15) and in 3D views, the isolation films 34 are actually perpendicular to the isolation films 24. Thus, the plurality of isolation films 24 run parallel to each other and perpendicular to the plurality of isolation films 34.

The top electrode can include a conductive material, such as Cu, Al, Ag, Au, Pt, W, etc. In some embodiments, the top electrode can include nitrides such as TiN, TaN, Ta or Ru. In a preferred embodiment, the top electrode 35 includes TiON meshed with SiN films. Thus, both the top and bottom electrodes 25, 35 can be, e.g., TiON meshed with SiN films. In other words, the top and bottom electrodes 25, 35 are formed from the same material.

Figure 11:
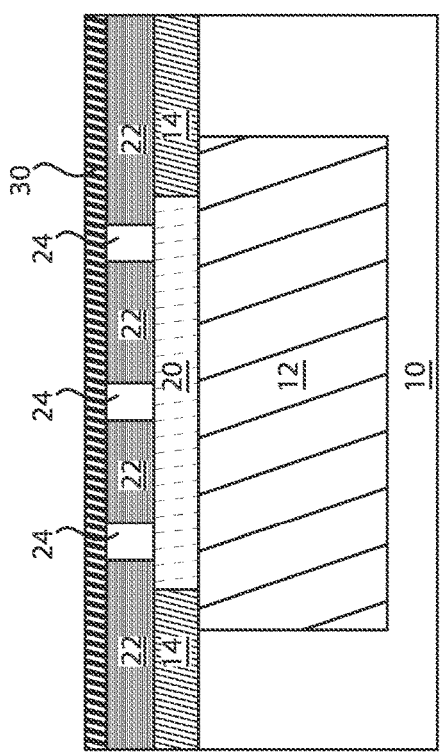
FIG. 11 is a cross-sectional view of the semiconductor structure of FIG. 10 where a metal layer and a hardmask layer are deposited, in accordance with an embodiment of the present invention.

FIG. 11 is a cross-sectional view of the semiconductor structure of FIG. 10 where a metal layer and a hardmask layer are deposited, in accordance with an embodiment of the present invention.

In various example embodiments, a metal layer 36 and a hardmask layer 38 are formed. The metal layer 36 can be, e.g., a tantalum nitride (TaN) layer.

In various embodiments, the hardmask layer 38 can be a nitride, for example, a silicon nitride (SiN), an oxynitride, for example, silicon oxynitride (SiON), or a combination thereof. In a preferred embodiment, the hardmask layer 38 can be silicon nitride (SiN), for example, $Si_3N_4$.

In one or more embodiments, the hardmask layer 38 can have a thickness in the range of about 20 nm to about 100 nm, or in the range of about 35 nm to about 75 nm, or in the range of about 45 nm to about 55 nm, although other thicknesses are contemplated.

Figure 12:
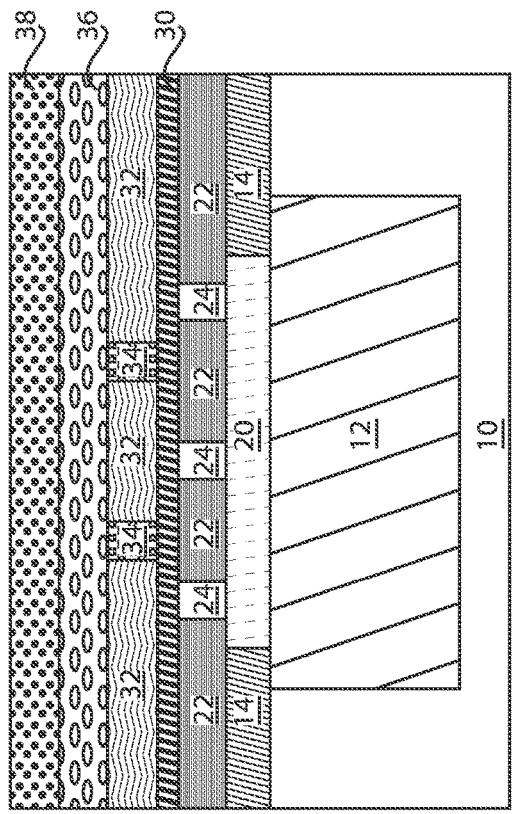
FIG. 12 is a cross-sectional view of the semiconductor structure of FIG. 11 where the metal layer and the hardmask layer are patterned, in accordance with an embodiment of the present invention.

FIG. 12 is a cross-sectional view of the semiconductor structure of FIG. 11 where the metal layer and the hardmask layer are patterned, in accordance with an embodiment of the present invention.

In various embodiments, the hardmask layer 38 and the metal layer 36 are etched by, e.g., RIE, to form remaining hardmask layer 38' and remaining metal layer 36'. The etching results in the exposure of a top surface of the top meshed electrode 35.

FIG. 13 is a cross-sectional view of the semiconductor structure of FIG. 12 where etching is performed to create a resistive random access memory (RRAM) stack, in accordance with an embodiment of the present invention.

In various example embodiments, etching takes place to form a RRAM stack 42. The etching results in openings 40 adjacent the RRAM stack 42. A top surface 15 of the remaining dielectric capping layer 14 is also exposed. The RRAM stack 42 thus includes a meshed bottom electrode 25, a hafnium oxide (HfO) layer, and a meshed top electrode 35. Additionally, a metal layer 36' and a hardmask 38' are part of the RRAM stack 42.

Figure 14:
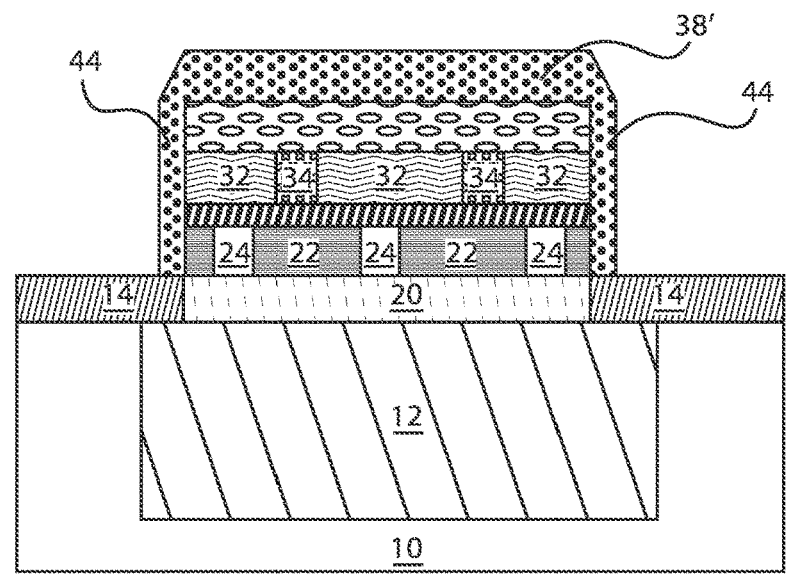
FIG. 14 is a cross-sectional view of the semiconductor structure of FIG. 13 where spacers are formed adjacent the RRAM stack, in accordance with an embodiment of the present invention.

FIG. 14 is a cross-sectional view of the semiconductor structure of FIG. 13 where spacers are formed adjacent the RRAM stack, in accordance with an embodiment of the present invention.

In various example embodiments, spacers 44 are formed adjacent the RRAM stack 42.

The spacers 44 can be formed by performing a deposition process, for example, a chemical vapor deposition process (CVD), followed by a directional etch process (e.g., reactive ion etch (RIE) to remove the spacer material from horizontal surfaces. The spacers 44 can include one layer or multiple layers of materials. For example, the spacers 44 can include silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycabonitride (SiOCN), and combinations thereof.

The thickness of the spacers 44 can generally vary and is not intended to be limited. In some embodiments, the thickness of the spacers 44 is in a range from about 3 to about 50 nm. In other embodiments, the thickness of the spacers 44 is in a range from about 10 to about 30 nm.

Figure 15:
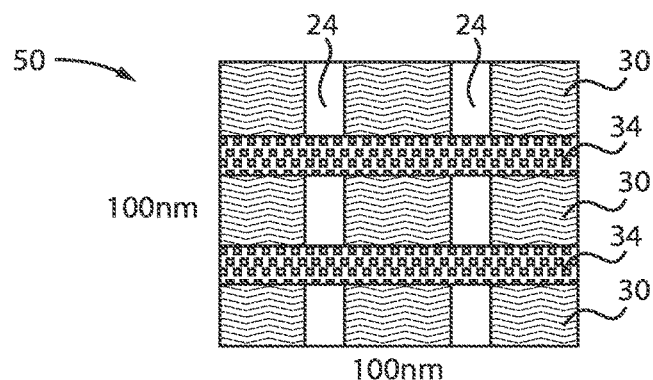
FIG. 15 is a top view of the meshed electrodes in a cross-bar array configuration, in accordance with an embodiment of the present invention.

FIG. 15 is a top view of the meshed electrodes in a cross-bar array configuration, in accordance with an embodiment of the present invention.

In various example embodiments, the top electrodes 35 are perpendicular to the bottom electrodes 25 to form a crosspoint or crossbar array 50. Thus, the meshed isolation films 24 of the bottom electrodes 25 are also perpendicular to the meshed isolation films 34 of the top electrodes 35. Thus, the isolation films 24 of the bottom electrode are shown perpendicular to the isolation films 34 of the top electrode. The isolation films 24 are separated from the isolation films 34 by metal oxide layer 30.

In various example embodiments, the conductive line 12 can be, for example, a metal or doped polysilicon (poly-Si). Non-limiting examples of metals include copper (Cu), cobalt (Co), aluminum (Al), platinum (Pt), gold (Au), tungsten (W), titanium (Ti), or any combination thereof. The metal line 12 can be deposited by a suitable deposition process, for example, chemical vapor deposition (CVD), plasma enhanced chemical vapor deposition (PECVD), physical vapor deposition (PVD), plating, thermal or e-beam evaporation, or sputtering.

As used throughout the instant application, the term "copper" is intended to include substantially pure elemental copper, copper including unavoidable impurities including a native oxide, and copper alloys including one or more additional elements such as carbon, nitrogen, magnesium, aluminum, titanium, vanadium, chromium, manganese, nickel, zinc, germanium, strontium, zirconium, silver, indium, tin, tantalum, and platinum. In embodiments, the copper alloy is a copper-manganese alloy. In further embodiments, in lieu of copper, cobalt metal (Co) or cobalt metal alloys can be employed. The copper-containing structures are electrically conductive. "Electrically conductive" as used through the present disclosure refers to a material having a room temperature conductivity of at least $10^{-8}$ $(\Omega\text{-m})^{-1}$.

In conclusion, the exemplary embodiments of the present invention employ meshed electrodes (e.g., TiON with SiN isolation regions) connected to common electrodes (e.g., TaN) for both top and bottom electrodes to form one unit cell. The unit cell is electrically divided into smaller sub-cells connected in parallel. Since all the sub-cells share the same HfO2 layer, it facilitates formation of an identical filament in each sub-cell. A highly resistive metal (e.g., TiON) can be employed as meshed electrodes to localize the filament growth. The measured device resistance is from a parallel connection of many identical filaments. This configuration should average out stochastic components of switching and improve variability.

Thus, a single memory unit cell with meshed electrodes is presented, connected in parallel with common electrodes. The meshed electrodes have high resistivity to localize filament formation (e.g., TiON) and insulator segments are embedded in both the top and bottom electrodes. The orientation of the embedded insulator segments in top and bottom electrodes are perpendicular to each other. Moreover, the steps of constructing the semiconductor structure include patterning metal electrodes and refilling with insulator segments, patterning the insulator segments and refilling with electrode material, patterning a stacked metal-insulator-metal thin film, which includes the insulator segments in the metal, and encapsulating the structure with another insulator or insulator segments. As a result, the exemplary embodiments of the present invention include multiple smaller sized electrodes within each cell to localize filament formation. Stated differently, multiple top electrode connections are formed within the same cell.

The exemplary embodiments reduce variability of switching characteristics by taking advantage of averaging effect for filaments connected in parallel. This is achieved by introducing meshed electrodes with high resistivity to form multiple localized filaments. The meshed electrodes are connected to shared electrodes to make parallel connection of filaments. The change in the configuration of the filament in response to electrical signals has a probabilistic nature and it manifests as variability and stochasticity in switching behaviors.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for employing a resistive memory device with meshed electrodes (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for incorporating a resistive random access memory (RRAM) stack within a resistive memory crossbar array, the method comprising:
   forming a bottom meshed electrode;
   depositing a dielectric layer over the bottom meshed electrode; and
   forming a top meshed electrode over the dielectric layer, wherein the bottom meshed electrode includes a plurality of first isolations films.

2. The method of claim 1, further comprising forming a conductive line within an interlayer dielectric (ILD).

3. The method of claim 2, further comprising constructing a barrier layer over a portion of the conductive line.

4. The method of claim 3, wherein the plurality of first isolation films are formed from silicon nitride (SiN).

5. The method of claim 4, wherein the plurality of first isolation films of the bottom meshed electrode are perpendicular to a plurality of second isolation films of the top meshed electrode.

6. The method of claim 1, further comprising forming a metal layer over the top meshed electrode.

7. The method of claim 6, further comprising forming a hardmask over the metal layer.

8. The method of claim 7, wherein the bottom meshed electrode, the dielectric layer, the top meshed electrode, the metal layer, and the hardmask define the RRAM stack.

9. The method of claim 8, further comprising forming spacers adjacent the RRAM stack.

10. The method of claim 1, wherein the top and bottom meshed electrodes are formed from a same material.

11. The method of claim 10, wherein the same material is titanium oxynitride (TiON).

12. A method for incorporating a resistive random access memory (RRAM) stack within a resistive memory crossbar array, the method comprising:
forming the RRAM stack over the conductive line, the RRAM stack constructed by:
forming a bottom meshed electrode;
depositing a dielectric layer over the bottom meshed electrode; and
forming a top meshed electrode over the dielectric layer, wherein the bottom meshed electrode includes a plurality of first isolations films.

13. The method of claim 12, wherein the top meshed electrode includes a plurality of second isolation films.

14. The method of claim 13, wherein the RRAM stack further includes a metal layer over the top meshed electrode.

15. The method of claim 14, wherein the RRAM stack further includes a hardmask over the metal layer.

16. The method of claim 15, further comprising forming spacers adjacent the RRAM stack.

17. The method of claim 16, wherein the top and bottom meshed electrodes are formed from a same material.

18. The method of claim 17, wherein the plurality of first and second isolation films are formed from silicon nitride (SiN).

19. The method of claim 18, wherein the plurality of first isolation films of the bottom meshed electrode are perpendicular to the plurality of second isolation films of the top meshed electrode.

* * * * *